(12) United States Patent
Chen et al.

(10) Patent No.: US 11,233,171 B2
(45) Date of Patent: Jan. 25, 2022

(54) SEMICONDUCTOR DEVICE (71) Applicant: EPISTAR CORPORATION, Hsinchu (TW)

(72) Inventors: Meng-Yang Chen, Hsinchu (TW); Jung-Jen Li, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 103 days.

(21) Appl. No.: 16/729,055

(22) Filed: Dec. 27, 2019

(65) Prior Publication Data

US 2020/0212257 A1    Jul. 2, 2020

(30) Foreign Application Priority Data

Dec. 28, 2018  (TW) ................................ 107147868

(51) Int. Cl.
*H01L 33/12* (2010.01)
*H01L 33/30* (2010.01)
*H01L 33/00* (2010.01)

(52) U.S. Cl.
CPC .......... *H01L 33/12* (2013.01); *H01L 33/0025* (2013.01); *H01L 33/30* (2013.01)

(58) Field of Classification Search
CPC ...... H01L 33/12; H01L 33/0025; H01L 33/30
See application file for complete search history.

(56) References Cited

U.S. PATENT DOCUMENTS

| 5,628,834 | A | 5/1997 | Copel et al. |
| 5,770,868 | A | 6/1998 | Gill et al. |
| 2008/0217652 | A1 | 9/2008 | Gheng et al. |
| 2009/0078311 | A1 | 3/2009 | Stan et al. |
| 2012/0168720 | A1 | 7/2012 | Akita et al. |
| 2013/0277713 | A1 | 10/2013 | Chyi et al. |

OTHER PUBLICATIONS

T. Higashino, Y. Kawamura, M. Fujimoto, A. Kondo, H. Takasaki, N. Inoue, Molecular beam epitaxial growth and characterization of GaAs/sub 0.5/Sb/sub 0.5/ layers on [111]B InP substrates, Conference Proceedings. 2001 International Conference on Indium Phosphide and Related Materials. 13th IPRM (Year: 2001).*

\* cited by examiner

*Primary Examiner* — Mark W Tornow
(74) *Attorney, Agent, or Firm* — Muncy, Geissler, Olds & Lowe, P.C.

(57) ABSTRACT

The present disclosure provides a semiconductor device which includes a base layer and a buffer structure. The base layer includes a first semiconductor compound having a first lattice constant and including a plurality of elements, and an atomic radius of one of the plurality of elements which has the largest atomic radius is defined as a first atomic radius. The buffer structure includes a second semiconductor compound and a first additive. The second semiconductor compound has a second lattice constant and the first additive has a second atomic radius. The second lattice constant is larger than the first lattice constant, and the second atomic radius is larger than the first atomic radius.

20 Claims, 5 Drawing Sheets

SEMICONDUCTOR DEVICE

CROSS REFERENCE TO RELATED APPLICATIONS

This application claims the right of priority based on TW Application Serial No. 107147868, filed on Dec. 28, 2018, and the content of which is hereby incorporated by reference in its entirety.

FIELD OF DISCLOSURE

The present disclosure relates to a semiconductor device, and particularly to a semiconductor device having a semiconductor stack.

BACKGROUND OF THE DISCLOSURE

With the rapid development of technology, semiconductor devices play a very important role in the areas of data transmission and energy conversion. The research and development of the related materials also continue. For example, III-V compound semiconductor made of Group III and Group V elements can be used in a variety of photoelectric devices, such as light-emitting diodes (LEDs), laser diodes (LDs), solar cells, lighting, medicine, display, communications, sensing, and power systems. The LED device is suitable for solid-state lighting sources and has the advantages of low power consumption and long life so it has been gradually replacing traditional light sources and widely used in traffic signs, backlight modules, lighting apparatuses, and medical equipment.

SUMMARY OF THE DISCLOSURE

The present disclosure provides a semiconductor device including a base layer and a buffer structure. The base layer includes a semiconductor compound. The semiconductor compound has a first lattice constant and includes a plurality of elements. An atomic radius of one of the plurality of elements which has the largest atomic radius is defined as a first atomic radius. The buffer structure includes a second semiconductor compound and a first additive. The second semiconductor compound has a second lattice constant and the first additive has a second atomic radius. The second lattice constant is greater than the first lattice constant and the second atomic radius is greater than the first atomic radius.

DETAILED DESCRIPTION OF THE DISCLOSURE

The following embodiments are described with accompanying drawings to disclose the concept of the present disclosure. In the drawings or description, the same or similar components are indicated with the same numerals. Furthermore, the shape or the dimension of each component in the drawings are only for demonstration and is not intended to limit the invention scope. Particularly, it should be noted that components which are not illustrated or described in drawings or description may be in a form that is known by a person skilled in the art.

In the present disclosure, if not otherwise specified, the general formula InGaP represents $In_{x1}Ga_{1-x1}P$, wherein $0<x1<1$; the general formula InGaAsP represents $In_{x2}Ga_{1-x2}As_{y2}P_{1-y2}$, wherein $0<x2<1$, and $0<y2<1$; the general formula InGaAs represents $In_{x3}Ga_{1-x3}As$, wherein $0<x3<1$; the general formula InAlGaAs represents $In_{x4}Al_{x5}Ga_{1-x4-x5}As$, wherein $0<x4<1$, and $0<x5<1$. Adjusting the content of the elements can achieve different purposes, for example, but not limited to, adjusting the energy level, or adjusting the dominant light-emitting wavelength of the light-emitting device when the semiconductor device is a light-emitting device.

For people having ordinary skill in the art, it is easy to introduce other components into the following embodiments. For example, the description of "forming a second layer on a first layer" means that the first layer directly contacts the second layer, or means that other layers may be interposed between the first layer and the second layer such that the two layers do not directly contact with each other unless otherwise stated in the disclosure. Additionally, the top-bottom relationship of the layers may vary as the structure or device operates or uses in different orientations. Furthermore, in the present disclosure, the description of a layer or structure "substantially consist of X material" means that the main composition of the layer or structure is X material, but does not exclude the inclusion of dopants or unavoidable impurities.

In the semiconductor device of the present disclosure, the qualitative or quantitative analysis of the compositions and additives included in each layer of the semiconductor device can be analyzed and determined by any suitable means such as SIMS (secondary ion mass spectrometer), and the thickness of each layer can be analyzed and determined by any suitable means, such as TEM (transmission electron microscopy) or SEM (scanning electron microscope).

Figure 1:
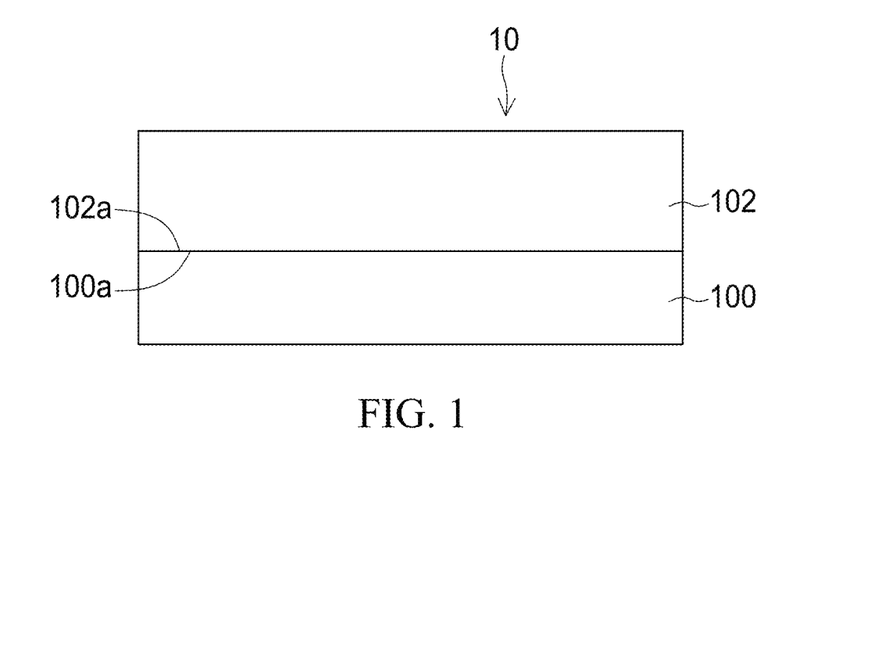
FIG. 1 shows a schematic view of a portion of a semiconductor device in accordance with one embodiment of the present disclosure.

FIG. 1 shows a schematic view of a portion of a semiconductor device in accordance with one embodiment of the present disclosure. The semiconductor device comprises a semiconductor structure 10. The semiconductor structure 10 includes a base layer 100 and a buffer structure 102. In the present embodiment, the buffer structure 102 is disposed on the base layer 100 and no other structure is interposed between the base layer 100 and the buffer structure 102 so that a surface 100a of the base layer 100 directly contacts a surface 102a of the buffer structure 102. The base layer 100 and the buffer structure 102 can be manufactured by Liquid Phase Epitaxy (LPE), Molecular Beam Epitaxy (MBE), Chemical Beam Epitaxy (CBE), Metal Organic Chemical Vapor Deposition (MOCVD), or hydride vapor phase epitaxial (HVPE), but is not limited thereto.

The base layer 100 includes a first semiconductor compound having a first lattice constant a1 and including a plurality of elements. The first semiconductor compound may be a III-V semiconductor compound, and the III-V semiconductor compound is a compound composed of one or more group III elements and one or more group V elements in the periodic table of the chemical elements, such as GaN, GaAs, InP, InGaAs, InGaP, InAlGaAs, or InGaAsP. Preferably, the base layer 100 substantially consists of the first semiconductor compound. The first semiconductor compound can be a binary or ternary material. Further, the first semiconductor compound is preferably a material composed of one or more group III elements and one or more group V elements. The group III element may be gallium (Ga) or indium (In). The Group V element may be arsenic (As) or phosphorus (P), and preferably not contain nitrogen (N). For example, the first semiconductor compound can be GaAs. Additionally, the above-mentioned lattice constants are measured by an X-ray diffraction spectrum tested on the corresponding semiconductor materials at a testing temperature of 300 K. The lattice constants of several semiconductor compounds are listed herein as a reference, as shown in Table 1 below. However, the first semiconductor compound is not limited thereto.

TABLE 1

| | lattice constant (Å) |
|---|---|
| GaP | 5.45 |
| AlP | 5.45 |
| GaAs | 5.65 |
| InP | 5.87 |
| GaSb | 6.09 |

Each of the plurality of elements in the first semiconductor compound has an atomic radius, and an atomic radius of one of the plurality of elements which has the largest atomic radius is defined as a first atomic radius. For example, when the first semiconductor compound is GaAs, the atomic radius of the constituent element Ga represents the first atomic radius because the atomic radius of Ga (about 1.30 Å) is larger than that of As (about 1.15 Å).

The buffer structure 102 is composed of a single layer or multiple layers. In one embodiment, the buffer structure 102 is a single layer and comprises a second semiconductor compound. The second semiconductor compound has a second lattice constant a2. When the buffer structure 102 comprises multiple layers and contains two or more semiconductor compounds, the second lattice constant is defined as an average value of the lattice constants of the semiconductor compounds. Preferably, the buffer structure 102 is a single layer and substantially consists of the second semiconductor compound. Specifically, the second semiconductor compound may be a III-V semiconductor compound, and is, e.g., a binary or ternary material. The group III element may be gallium (Ga) or indium (In). The Group V element may be arsenic (As) or phosphorus (P), and preferably not contain nitrogen (N). For example, the second semiconductor compound can be InP or InGaP. In one embodiment, the constituent elements of the second semiconductor compound are completely different from the constituent elements of the first semiconductor compound. For example, the constituent elements of the first semiconductor compound are gallium (Ga) and arsenic (As), and the constituent elements of the second semiconductor compound are phosphorus (P) and indium (In). In another embodiment, one of the constituent elements of the second semiconductor compound is the same as one of the constituent elements of the first semiconductor compound. For example, the constituent elements of the first semiconductor compound are gallium (Ga) and arsenic (As), and the constituent elements of the second semiconductor are gallium (Ga), phosphorus (P), and indium (In) where the same constituent element is gallium (Ga). In one embodiment, the second lattice constant a2 is greater than the first lattice constant a1, that is, the difference Δa % between the first lattice constant a1 and the second lattice constant a2 is greater than zero. The difference Δa % between the first lattice constant a1 and the second lattice constant a2 may be more than 0.5% and less than 10%, preferably more than 0.5% and less than 5%, more than 2.5% and less than 10%, or more than 2.5% and less than 5%. In detail, the difference between the first lattice constant a1 and the second lattice constant a2 can be calculated by the following formula:

$$\Delta a\ \% = ((a2-a1)/a1)*100\%.$$

Optionally, the buffer structure 102 may comprise a first additive and the first additive has a second atomic radius. The second atomic radius means the largest atomic radius among the atomic radiuses of the constituent elements in the first additive. In the present embodiment, the second atomic radius is greater than the first atomic radius, that is, the largest atomic radius among the atomic radiuses of the constituent elements in the first additive is greater than the largest atomic radius among the atomic radiuses of the constituent elements in the first semiconductor compound. In detail, in the case where the composition of the first additive is a single element, the second atomic radius is the atomic radius of the single element. In the case where the composition of the first additive is a compound, the second atomic radius is the atomic radius of one of the constituent elements which has the largest atomic radius of the compound. Additionally, when the first atomic radius is set to r1 and the second atomic radius is set to r2, the first atomic radius r1 and the second atomic radius r2 preferably satisfy the following formula:

$$(r2-r1)/r1 > 0.05.$$

Furthermore, the first additive preferably comprises a single element. The first additive is preferably present in the buffer structure 102 in a doped form. If the amount of the first additive is too large, the first additive easily forms another semiconductor compound with the first semiconductor layer so that the surface epitaxial quality of the buffer structure is poor or electrical abnormality may happen. Specifically, the first additive preferably contains antimony (Sb), indium (In), or Tellurium (Te), and more preferably contains antimony (Sb). In one embodiment, the first additive is substantially composed of a single element, such as antimony (Sb), indium (In), or tellurium (Te). Specifically, in the buffer structure 102, the maximum concentration of the first additive is, for example, less than $1 \times 10^{18}/cm^3$, preferably $5 \times 10^{17}/cm^3$ or less, more preferably $2.5 \times 10^{17}/cm^3$ or less, and preferably more than $2 \times 10^{16}/cm^3$, more preferably $1 \times 10^{17}/cm^3$ or more. In some embodiments, when the maximum concentration of the first additive is more than $1 \times 10^{18}/cm^3$, the crystallinity of the buffer structure 102 may be deteriorated, and when the maximum concentration of the first additive is below $2\times10^{16}/cm^3$, it is difficult to obtain good crystallization quality. In some embodiments, when the maximum concentration of the first additive is between $1\times10^{17}/cm^3$ and $5\times10^{17}/cm^3$ (both inclusive), stable and good epitaxial quality can be obtained.

The thickness of the base layer 100 is in the range of 1 μm to 1000 μm. The thickness of the buffer structure 102 may be less than 5 μm, preferably in the range of 1 μm to 4 μm. By setting the thickness of the base layer 100 and the buffer structure 102 within the above range, device miniaturization can be further achieved, and a stabler stack can be obtained.

In some embodiments, the buffer structure 102 comprises a metamorphic epitaxial structure. The metamorphic epitaxial structure is, for example, substantially composed of a plurality of epitaxial layers, and the constituent elements in each of the epitaxial layers are the same, but the composition ratios of each constituent element in the plurality of epitaxial layers are different. In some embodiments, each epitaxial layer comprises InGaP. Preferably, each epitaxial layer substantially consists of InGaP. As described above, the InGaP of each layer can be expressed by the formula $In_{x1}Ga_{1-x1}P$, where $0<x1<1$, and the value of x1 is, for example, gradually increased or decreased from one side of the epitaxial structure to the other side of the epitaxial structure. For example, the epitaxial layer closest to the base layer 100 contains $In_{0.5}Ga_{0.5}P$, and the epitaxial layer farthest from the base layer 100 contains $In_{0.95}Ga_{0.05}P$. In some embodiments, the use of a metamorphic epitaxial structure can further improve the quality of the epitaxial structure to avoid epitaxial defects.

In some embodiments, the buffer structure 102 further includes a second additive. The second additive can be different from the first additive and can be used to adjust the conductivity-type of the buffer structure 102. The second additive forms a bond with other elements in the buffer structure 102. In some embodiments, the second additive is substantially composed of a single element. Specifically, the second additive can be silicon (Si), tellurium (Te), carbon (C), zinc (Zn), or magnesium (Mg). Furthermore, the maximum concentration of the second additive is preferably greater than the maximum concentration of the first additive in the buffer structure 102. Specifically, in the buffer structure 102, the maximum concentration of the second additive is preferably more than $1\times10^{18}/cm^3$ and less than $2\times10^{19}/cm^3$, more preferably more than $1\times10^{18}/cm^3$ and less than $1\times10^{19}/cm^3$. When the maximum concentration of the second additive is within the above-mentioned range, the effect of adjusting the conductivity-type of the buffer structure 102 is better.

Figure 2:
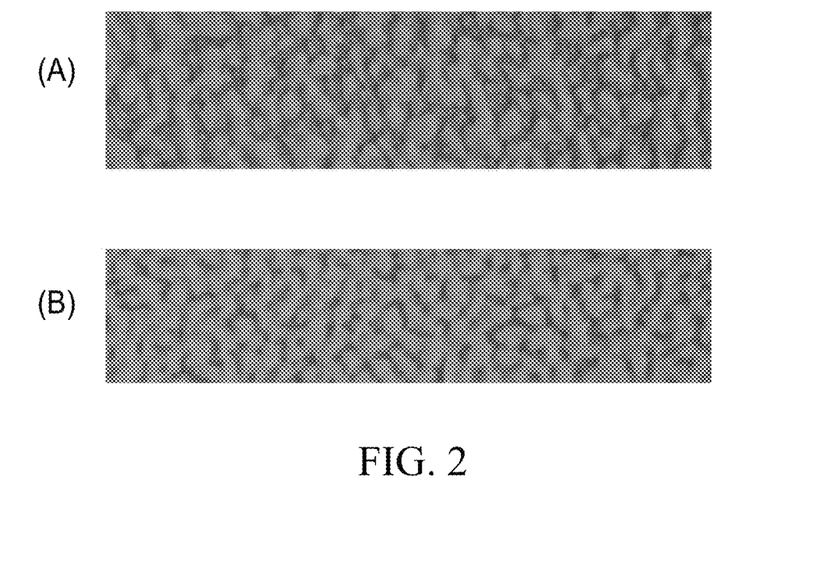
FIG. 2 shows OM photos showing a portion of a semiconductor device with and without a first additive in accordance with one embodiment of the present disclosure.

FIG. 2 is OM (optical microscope) photos showing a portion of a semiconductor device with and without a first additive in accordance with one embodiment of the present disclosure. When comparing the semiconductor structure without the first additive (FIG. 2(A)) with the semiconductor structure with the first additive (FIG. 2(B)) under the same epitaxial growth conditions, the semiconductor structure containing the first additive (FIG. 2(B)) has a good surface uniformity and an appearance of the two-dimensional growth mode.

Figure 3:
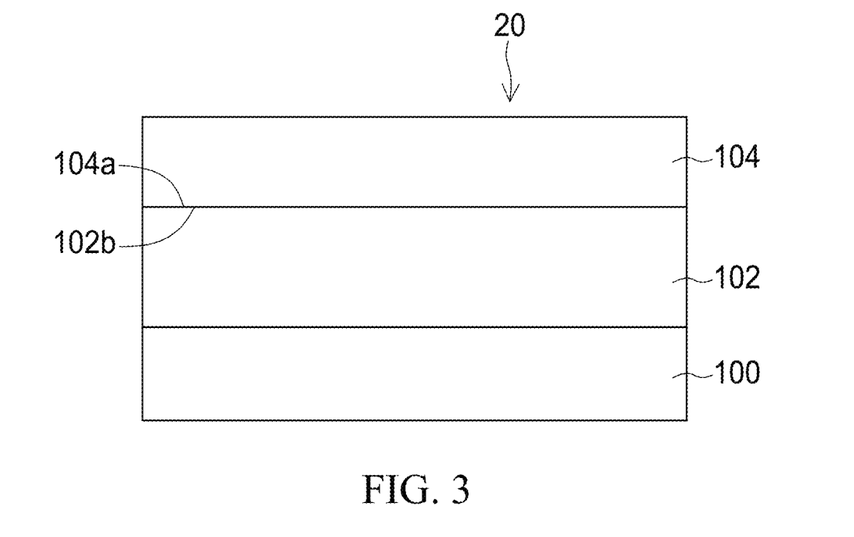
FIG. 3 shows a schematic view of a portion of a semiconductor device in accordance with another embodiment of the present disclosure.

FIG. 3 shows a schematic view of a portion of a semiconductor device in accordance with another embodiment of the present disclosure. The semiconductor structure 20 differs from the semiconductor structure 10 in that a cover layer 104 is further formed on the base layer 100 and the buffer structure 102. As shown in FIG. 3, a surface 104a of the cover layer 104 is in direct contact with a surface 102b of the buffer structure 102 on the base layer 100. The cover layer 104 is manufactured by, for example, liquid phase epitaxy (LPE), molecular beam epitaxy (MBE), chemical beam epitaxy (CBE), metal organic chemical vapor phase, Metal Organic Chemical Vapor Deposition (MOCVD), or hydride vapor phase epitaxial (HVPE), but is not limited thereto. Specifically, the base layer 100, the buffer structure 102, and the cover layer 104 can be sequentially formed by the above-described epitaxial technique and thereby the semiconductor structure 20 as shown in FIG. 3 is obtained. Further, the material of the cover layer 104 can be a III-V semiconductor compound, such as a binary III-V semiconductor compound. The group III element may be gallium (Ga) or indium (In). The Group V element may be arsenic (As) or phosphorus (P), and preferably not contain nitrogen (N). Preferably, the cover layer 104 substantially consists of a binary III-V semiconductor compound, such as InP. In some embodiments, the cover layer 104 acts as a stress-adjusting layer or a protective layer.

Figure 4:
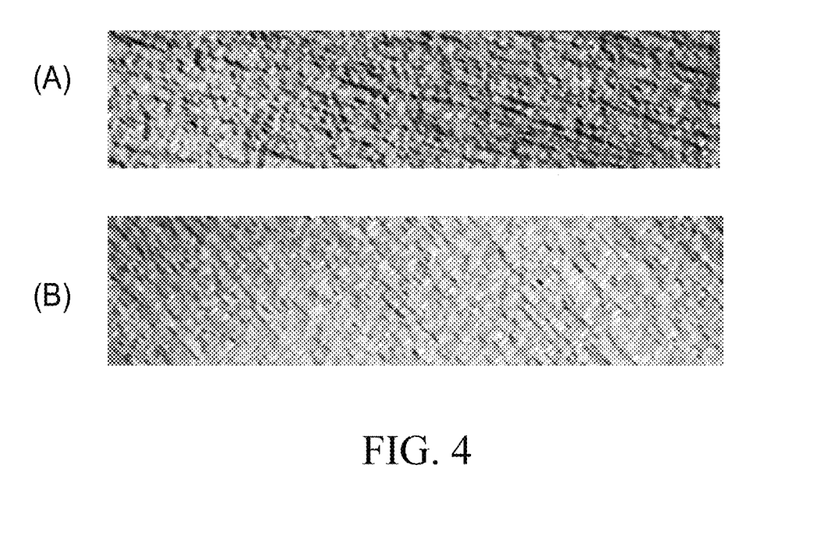
FIG. 4 shows OM photos showing a portion of a semiconductor device with and without a first additive in accordance with one embodiment of the present disclosure.

FIG. 4 is OM photos showing a portion of a semiconductor device with and without a first additive in accordance with one embodiment of the present disclosure. Under the same epitaxial growth conditions, when comparing the semiconductor structure without the first additive (FIG. 4(A)) with the semiconductor structure adding the first additive (FIG. 4(B)), the surface epitaxial defect density is significantly reduced, indicating that the addition of the first additive improves the epitaxial quality. In other words, the good epitaxial quality can be maintained even if the cover layer is further formed on the buffer structure containing the first additive.

Figure 5:
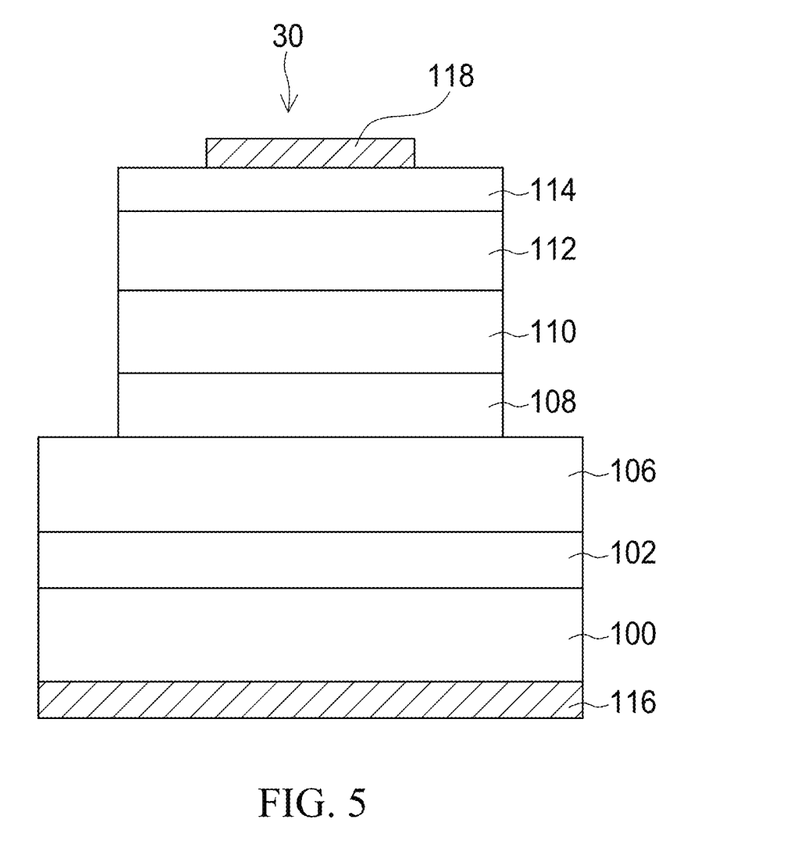
FIG. 5 shows a schematic view of a semiconductor device in accordance with another embodiment of the present disclosure.

FIG. 5 shows a schematic view of a semiconductor device in accordance with another embodiment of the present disclosure. The semiconductor device 30 includes a base layer 100, a buffer structure 102, a first-type semiconductor structure 106, an active structure 108, a second-type semiconductor structure 110, a first electrode 116, and a second electrode 118. In the present embodiment, the semiconductor device 30 is an LED device, and the base layer 100 is a growth substrate of the LED device. The compositions and other description of the base layer 100 and the buffer structure 102 can be referred to the foregoing description, and are not described herein again. In another embodiment, the semiconductor device 30 can be a laser device, a photo-detecting device (such as a photodiode), or the like.

The active structure 108 comprises a single heterostructure (SH), a double heterostructure (DH), a double-side double heterostructure (DDH), or a multiple quantum well (MQW) structure. In one embodiment, the active structure 108 can be a double heterostructure. When the semiconductor device 30 is in operation, the active structure 108 emits radiation. The radiation is preferably red or infrared light. Further, when the radiation is infrared light, a peak wavelength of the infrared light is preferably within a range between 800 nm and 1700 nm (both inclusive), e.g., 810 nm, 840 nm, 910 nm, 940 nm, 1050 nm, 1070 nm, 1100 nm, 1200 nm, 1300 nm, 1400 nm, 1450 nm, 1500 nm, 1550 nm, 1600 nm, 1650 nm, or 1700 nm. The active structure 108 may comprise a III-V semiconductor compound. The group III element may be gallium (Ga) or indium (In). The Group V element may be arsenic (As) or phosphorus (P), and preferably not contain nitrogen (N). In one embodiment, the active structure 108 comprises a quaternary III-V semiconductor material, such as InGaAsP.

The first-type semiconductor structure 106 and the second-type semiconductor structure 110 are respectively located on two sides of the active structure 108, and the conductivity-type of the first-type semiconductor structure 106 is opposite to the conductivity-type of the second-type semiconductor structure 110. Specifically, when the first-type semiconductor structure 106 is an n-type semiconductor, the second-type semiconductor structure 110 is a p-type semiconductor to provide electrons and holes, respectively. Alternatively, the first-type semiconductor structure 106 is a p-type semiconductor and the second-type semiconductor structure 110 is an n-type semiconductor. Further, the first-type semiconductor structure 106 and/or the second-type semiconductor structure 110 may have a single-layer structure or a multilayer structure. The first-type semiconductor structure 106 and the second-type semiconductor structure 110 may comprise a III-V semiconductor compound, such as quaternary III-V semiconductor material. The group III element may be gallium (Ga) or indium (In). The Group V element may be arsenic (As) or phosphorus (P), and preferably not contain nitrogen (N). In one embodiment, the first-type semiconductor structure 106, the second-type semiconductor structure 110, and active structure 108 comprise the same III-V semiconductor material. Preferably, the first-type semiconductor structure 106 and the second-type semiconductor structure 110 substantially consist of a quaternary III-V semiconductor material such as InGaAsP.

The first electrode 116 and the second electrode 118 are respectively located on two opposite sides of the base layer 100 and are electrically connected to the base layer 100, the buffer structure 102, the first-type semiconductor structure 106, the active structure 108, and the second-type semiconductor structure 110 to form a vertical-type LED device which the disclosure is not limited to. In some embodiments, the first electrode 116 and the second electrode 118 may also be located on the same side of the base layer 100 to form a horizontal-type LED device. The materials of the first electrode 116 and the second electrode 118 may be the same or different, and preferably comprise a metal or an alloy. The metal is, for example, aluminum (Al), chromium (Cr), copper (Cu), tin (Sn), gold (Au), nickel (Ni), titanium (Ti), platinum (Pt), lead (Pb), zinc (Zn), cadmium (Cd), antimony (Sb), Germanium (Ge), Beryllium (Be), or cobalt (Co). The alloy may include at least two metal elements selected from the above metal elements, such as GeAuNi, BeAu, GeAu, or ZnAu.

In the present embodiment, a window layer 112 and a contact layer 114 are further included between the second-type semiconductor structure 110 and the second electrode 118. The conductivity-type of the window layer 112 may be the same as that of the second-type semiconductor structure 110 and may serve as a light extraction layer to enhance the luminous efficiency of the semiconductor device 30. Additionally, the window layer 112 is transparent to the light emitted by the active structure 108. The contact layer 114 is used to conduct current. Specifically, the contact layer 114 is, for example, a doped or undoped semiconductor layer. When the second electrode 118 contains a metal or an alloy, an ohmic contact may be formed between the contact layer 114 and the second electrode 118. The contact resistance between the contact layer 114 and the second electrode 118 may be less than $10^{-6}$ Ω-cm. Thereby, the second electrode 118 can be electrically connected to other layers in the semiconductor device 30. Further, the conductivity-type of the contact layer 114 is, for example, the same as that of the second-type semiconductor structure 110.

Figure 6:
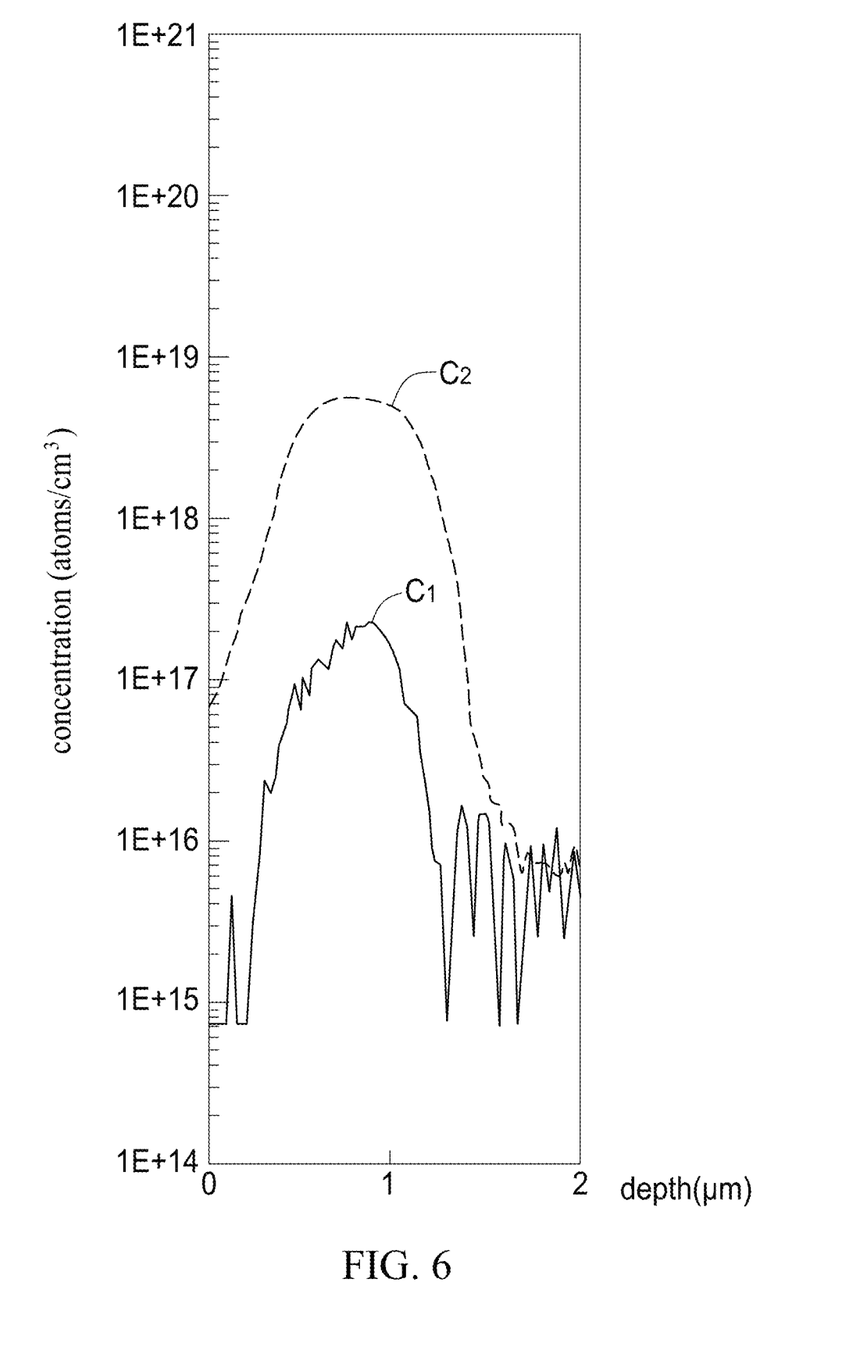
FIG. 6 is a graph showing the relationship between the element concentration and the depth of a portion of a semiconductor device in accordance with another embodiment of the present disclosure.

FIG. 6 is a graph showing the relationship between the element concentration and the depth of a partial region of a semiconductor device in accordance with another embodiment of the present disclosure. Specifically, FIG. 6 is a SIMS (secondary ion mass spectrometry) analysis diagram of a portion of the buffer structure 102 of the semiconductor device. The buffer structure 102 of the present embodiment is a single layer and contains a III-V semiconductor compound composed of a group III element of indium (In) and a group V element of phosphorus (P). Additionally, the buffer structure 102 includes a first additive of antimony (Sb) and a second additive of silicon (Si). In the buffer structure 102, the concentration of the first additive of antimony (Sb) is represented by C1, and the concentration of the second additive of silicon (Si) is represented by C2. As shown in FIG. 6, the maximum of the concentration C1 of the first additive is smaller than the maximum of the concentration C2 of the second additive, and the maximum of the concentration C1 of the first additive is between $1\times10^{17}/cm^3$ and $5\times10^{17}/cm^3$ (both inclusive) and are preferably about $2\times10^{17}/cm^3$. The maximum of the concentration C2 of the second additive is between $1\times10^{18}/cm^3$ and $1\times10^{19}/cm^3$ (both inclusive) and is preferably about $5\times10^{18}/cm^3$. In some embodiments, the ratio of the maximum of the concentration C1 of the first additive to the maximum of the concentration C2 of the second additive is preferably between 1:10 and 1:50 (both inclusive), and more preferably between 1:15 and 1:35 (both inclusive).

Figure 7:
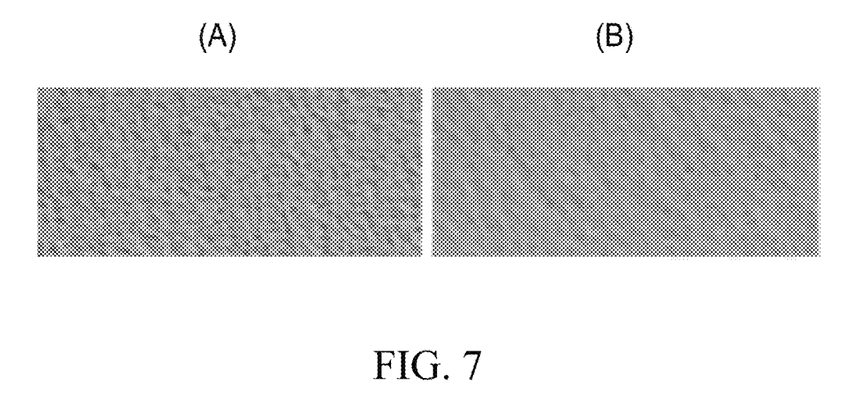
FIG. 7 shows OM photos showing a portion of a semiconductor device with and without a first additive in accordance with one embodiment of the present disclosure.

FIG. 7 shows OM photos showing a portion of a semiconductor device with and without a first additive in accordance with one embodiment of the present disclosure. Under the same epitaxial growth conditions, when comparing the semiconductor structure without the first additive (FIG. 7(A)) with the semiconductor structure with the first additive (B of FIG. 7)), the surface epitaxial defects of FIG. 7(B) are significantly reduced. Additionally, after further testing, the buffer structure including the first additive does not affect the electrical properties of the layers in the semiconductor device and maintains good device operation.

In another aspect, the base layer 100 disclosed in the present disclosure is not limited to a substrate of the semiconductor device. In some embodiments, the base layer 100 and the buffer structure 102 are presented as a layered stack in the semiconductor device. Further, the semiconductor device may further include two or more layered stacks each composed of the base layer 100 and the buffer structure 102, and the layered stacks in the device are, for example, separated from and not directly contacted with each other. Furthermore, in the semiconductor device of one embodiment, each of the layered stacks may comprise different combinations of semiconductor materials with different functionality.

Figure 8:
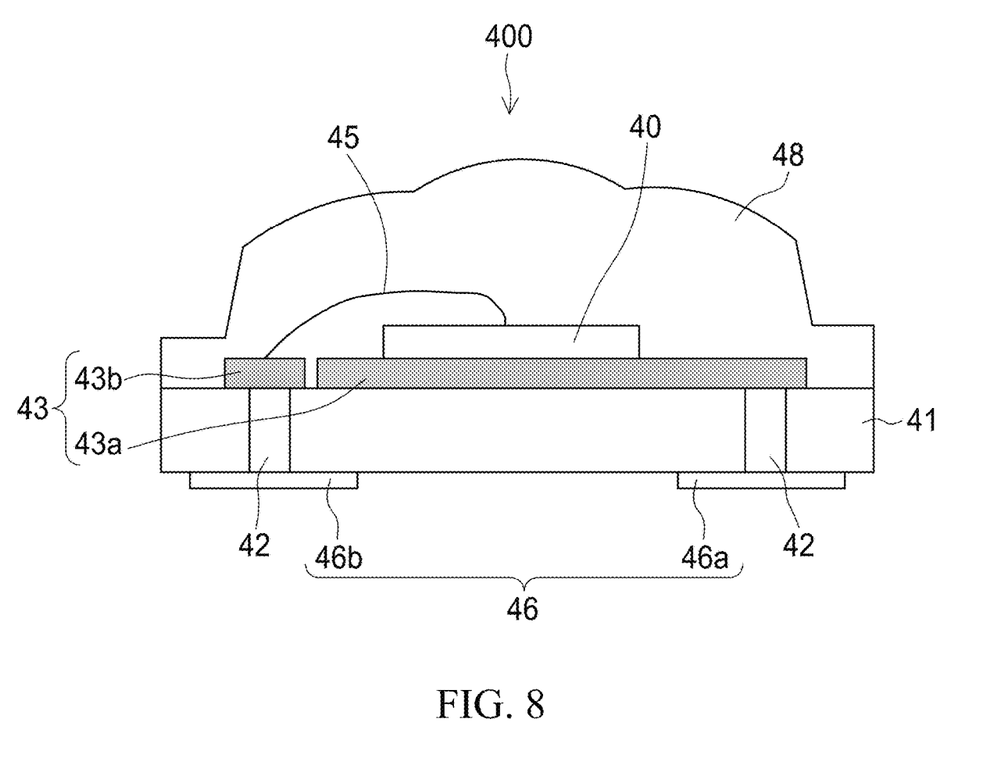
FIG. 8 shows a schematic view of a package structure of a semiconductor device in accordance with one embodiment of the present disclosure.

FIG. 8 is a schematic view showing a package structure of a semiconductor device in accordance with one embodiment of the present disclosure. Referring to FIG. 8, the package structure 400 includes a semiconductor device 40, a package substrate 41, a carrier 43, a bonding wire 45, a contact structure 46, and an encapsulation material 48. The package substrate 41 may comprise ceramic or glass. The package substrate 41 has a plurality of through-holes 42 therein. The through-holes 42 may be filled with a conductive material such as metal to enhance electrical conduction or/and heat dissipation. The carrier 43 is located on a surface of one side of the package substrate 41, and also contains an electrically conductive material such as metal. The contact structure 46 is on a surface on the other side of the package substrate 41. In the present embodiment, the contact structure 46 includes contact pads 46a and 46b, and the contact pads 46a and 46b can be electrically connected to the carrier 43 through the through-holes 42. In one embodiment, the contact structure 46 may further include a thermal pad (not shown), such as between the contact pad 46a and the contact pad 46b. The semiconductor device 40 is located on the carrier 43 and can be the semiconductor device described in any of the embodiments in the present disclosure. In the present embodiment, the carrier 43 includes a first portion 43a and a second portion 43b, and the semiconductor device 40 is electrically connected to the second portion 43b of the carrier 43 by the bonding wire 45. The material of the bonding wire 45 may include metal, such as gold, silver, copper, aluminum, or an alloy containing at least one of the above elements. The encapsulation structure 48 covers the semiconductor device 40 and functions to protect the semiconductor device 40. Specifically, the encapsulating structure 48 may comprise a resin material such as epoxy, silicone, or the like. The encapsulating structure 48 may further include a plurality of wavelength converting particles (not shown) to convert the first light emitted by the semiconductor device 40 into a second light. The wavelength of the second light is greater than the wavelength of the first light.

The light-emitting device of the present disclosure can be applied to products in the fields of lighting, medical treatment, display, communication, sensing, power supply system, etc., such as lamps, monitors, mobile phones, tablet computers, vehicle dashboards, televisions, computers, wearable devices (such as Watches, bracelets, or necklaces), traffic signs, outdoor displays, or medical equipment.

Although the present invention has been disclosed in the foregoing embodiments, it is not intended to limit the invention, and it is understood by those skilled in the art that the invention may be modified or changed without departing from the spirit and scope of the invention. The scope of the invention is defined by the scope of the appended claims. Furthermore, the foregoing embodiments may be combined or substituted with each other as appropriate, and are not limited to the specific embodiments described. For example, the related parameters of a specific component or the connection relationship between a specific component and other components disclosed in one embodiment may also be applied to other embodiments, and all fall within the scope of the present invention.

What is claimed is:

1. A semiconductor device comprising:
    a base layer comprising a first semiconductor compound, wherein the first semiconductor compound has a first lattice constant and includes a plurality of constituent elements and wherein an atomic radius of one of the constituent elements of the first semiconductor compound which has the largest atomic radius is defined as a first atomic radius; and
    a buffer structure comprising a second semiconductor compound, a first additive having a second atomic radius, and a second additive, wherein the second semiconductor compound has a second lattice constant and includes a plurality of constituent elements;
    wherein the second additive comprises silicon (Si), tellurium (Te), carbon (C), zinc (Zn) or magnesium (Mg), and the second lattice constant is greater than the first lattice constant, and the second atomic radius is greater than the first atomic radius.

2. The semiconductor device according to claim 1, wherein in the buffer structure, a maximum concentration of the first additive is less than $1\times10^{18}/cm^3$.

3. The semiconductor device of claim 1, wherein the first additive is antimony (Sb).

4. The semiconductor device according to claim 1, wherein the difference between the first lattice constant and the second lattice constant is greater than 0.5%.

5. The semiconductor device according to claim 1, wherein the first semiconductor compound and the second semiconductor compound are III-V semiconductor compounds.

6. The semiconductor device according to claim 1, wherein all of the constituent elements of the second semiconductor compound are completely different from all of the constituent elements of the first semiconductor compound.

7. The semiconductor device according to claim 1, wherein one of the constituent elements of the second semiconductor compound is the same as one of the constituent elements of the first semiconductor compound.

8. The semiconductor device according to claim 1, wherein the constituent elements of the first semiconductor compound comprise gallium (Ga) and arsenic (As), and the constituent elements of the second semiconductor compound comprise phosphorus (P) and indium (In).

9. The semiconductor device according to claim 6, wherein the first semiconductor compound comprises GaAs, and the second semiconductor compound comprises InP.

10. The semiconductor device according to claim 7, wherein the first semiconductor compound comprises GaAs, and the second semiconductor compound comprises InGaP.

11. The semiconductor device of claim 1, wherein in the buffer structure, a maximum concentration of the second additive is greater than a maximum concentration of the first additive.

12. The semiconductor device of claim 1, wherein in the buffer structure, the maximum concentration of the first additive is between $1\times10^{17}/cm^3$ and $5\times10^{17}/cm^3$.

13. The semiconductor device according to claim 1, wherein the second additive has a maximum concentration of less than $1\times10^{19}/cm^3$ in the buffer structure.

14. The semiconductor device of claim 13, wherein the maximum concentration of the second additive is between $1\times1018/cm3$ and $1\times1019/cm3$.

15. The semiconductor device of claim 1, wherein the buffer structure comprises a metamorphic epitaxial structure.

16. The semiconductor device of claim 1, wherein the buffer structure comprises a plurality of epitaxial layers, each of the epitaxial layers includes a plurality of constituent elements, and the constituent elements in each of the epitaxial layers are the same but the composition ratios of each constituent element in the plurality of epitaxial layers are different.

17. The semiconductor device of claim 1, wherein the base layer directly contacts the buffer structure.

18. The semiconductor device of claim 1, further comprising a first-type semiconductor structure, an active structure, and a second-type semiconductor structure; wherein the active structure is capable of emitting radiation having a peak wavelength between 800 nm and 1700 nm.

19. The semiconductor device of claim 1, further comprising a cover layer on the buffer structure.

20. The semiconductor device of claim 1, further comprising an electrode contacting the base layer.

* * * * *